United States Patent

Svedberg Per

[15] 3,641,404

[45] Feb. 8, 1972

[54] THYRISTOR CIRCUIT

[72] Inventor: Svedberg Per, Vallingby, Sweden

[73] Assignee: Allmanna Svenska Elektriska Aktiebolaget, Vasteras, Sweden

[22] Filed: June 5, 1969

[21] Appl. No.: 830,807

[30] Foreign Application Priority Data

June 5, 1968 Sweden..................................7485/68

[52] U.S. Cl...............317/235 R, 317/235 AA, 317/235 AB, 317/235 AJ, 317/235 AQ, 307/252, 307/305

[51] Int. Cl.........................................H01l 11/00, H01l 15/00

[58] Field of Search.....................317/234, 235, 41, 41.1, 44; 307/305, 324

[56] References Cited

UNITED STATES PATENTS

| | | | |
|---|---|---|---|
| 2,980,832 | 4/1961 | Stein et al. | 317/235 |
| 3,251,004 | 5/1966 | Shombert et al | 317/235 |
| 3,391,310 | 7/1968 | Gentry | 317/235 |
| 3,210,621 | 10/1965 | Strull | 317/235 |
| 3,286,105 | 11/1966 | Attwood | 317/235 X |
| 3,356,862 | 12/1967 | Diebold et al | 317/235 X |
| 3,401,320 | 9/1968 | Weinstein | 317/235 |
| 3,489,962 | 1/1970 | McIntyre et al. | 317/235 |

FOREIGN PATENTS OR APPLICATIONS

| | | | |
|---|---|---|---|
| 1,498,740 | 9/1967 | France | 317/235 |

*Primary Examiner*—John W. Huckert
*Assistant Examiner*—Andrew J. James
*Attorney*—Jennings Bailey, Jr.

[57] ABSTRACT

A thyristor circuit includes a first thyristor with first and second emitter layers and two base layers arranged therebetween. The first emitter layer has two separate parts. The first part is provided with a connection for the load current of the thyristor. A second thyristor is connected between the second part of the first emitter layer and the load current connection to the first part. The breakover voltage in the forward direction of the series connection of the second thyristor and the partial thyristor composed of the second part of the first emitter layer and the other layers of the first thyristor is lower than the breakover voltage of the first thyristor. As a result, upon increase of off-state voltage the second thyristor breaks over first with the production of a simultaneous ignition over a large surface.

8 Claims, 3 Drawing Figures

Figure 1:
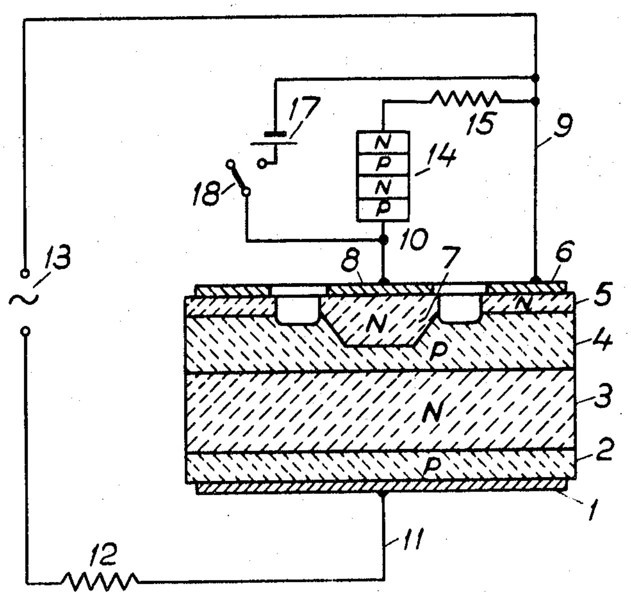

INVENTOR.
PER SVEDBERG
BY
Jennings Bailey, Jr.

INVENTOR.
PER SVEDBERG
BY
Jennings Bailey Jr

THYRISTOR CIRCUIT

BACKGROUND OF THE INVENTION

1. Field of the Invention

The present invention relates to a thyristor circuit comprising a first thyristor with a first and a second emitter layer and two base layers arranged between them, the first emitter layer consisting of two separate parts, the first of these parts being provided with a connection for the load current of the thyristor.

2. The Prior Art

A thyristor comprises a semiconductor body with four layers of alternate conductivity types, the two outer layers of which, the emitter layers, are more strongly doped than the two inner layers, the base layers. The cathode contact of the thyristor is connected to the N-conducting emitter layer and its anode contact to the P-conducting layer. If a certain off-state voltage is exceeded (the anode positive in relation to the cathode), the thyristor breaks over, that is, the leakage current through the blocking center junction, and thus the injection from the emitter layers, increases so powerfully that said junction will change polarity in the conducting direction and the thyristor starts to carry current with a low voltage drop. Because of unavoidable differences in the thyristor, the breakover will take place first in a small area of the thyristor and with a rapidly increasing load current, which thus flows only through this small area, there is a serious risk that the thyristor will become overloaded within this area and be destroyed.

It is known that this risk is avoided by connecting a reactor in series with the thyristor so that the speed of growth of the load current after the breakover can be reduced so far that the current does not reach its full value until the ignition has spread over the entire thyristor surface. Such a reactor, however, has serious drawbacks in other respects.

SUMMARY OF THE DISCLOSURE

According to the invention damages at breakover are avoided by giving the thyristor a good breakover capability (ability to withstand a rapidly increasing current without damage after breakover). A thyristor circuit according to the invention is characterized in that the second of the two parts of the first emitter layer is connected through an auxiliary thyristor to the load current connection of the first part and that the breakover voltage in the forward direction of the series connection of the auxiliary thyristor and the partial thyristor consisting of the second part of the first emitter layer and the other layers of the first thyristor is arranged to be lower than the breakover voltage for the rest of said first thyristor.

Thus, when the circuit it suitably dimensioned, it is achieved that increasing off-state voltage the second thyristor breaks over first so that the voltage over it falls to a low value. The voltage over the partial thyristor series connected thereto thyristor then increases instantaneously and the partial thyristor is ignited simultaneously over its entire surface, mainly because of the capacitive current surge flowing through the thyristor. Thus a simultaneous ignition is obtained over such a large surface that the thyristor is not destroyed by a rapidly increasing load current. The ignition then spreads in the normal manner sideways over the thyristor surface.

According to a further development of the invention, an impedance element, such as a reactor or a resistor, is connected in series with said second thyristor to limit the current therethrough and through said partial thyristor at least for so long as the ignition needs to spread over the rest of the first thyristor.

The sum of the breakover voltages of the partial thyristor and the auxiliary thyristor can be made lower than the breakover voltage in the other part of the first thyristor by, according to one embodiment, making the base layer adjacent the first emitter layer thinner under said second part than under the other parts of this emitter layer. In this way the partial thyristor in series connection with the auxiliary thyristor has higher current amplification and thus lower breakover voltage than the other part of the first thyristor.

This can also be achieved by making the charge carrier lifetime in the base layers higher in the partial thyristor connected in series with said auxiliary thyristor than in the other part of the first thyristor, for example, by giving this latter part a higher concentration of a heavy metal, preferably gold, reducing the carrier lifetime. This can be done in a manner known per se by diffusing gold into the semiconductor body, the partial thyristor being suitably masked. Said auxiliary thyristor may most easily consist of a PNPN diode, a so-called diode-thyristor.

By using a controlled thyristor instead, this can also be used for normal ignition. An optically controlled thyristor is preferably used in this case, thus avoiding the problem of transmitting control pulses over possible potential differences.

According to one embodiment of the invention a bias voltage source is connected in series with the mentioned auxiliary thyristor, having such polarity that the off-state voltage over the series connection of said partial thyristor and the auxiliary thyristor is so much higher than over the rest of the first thyristor that at increasing off-state voltage the auxiliary thyristor breaks over first and ignites the partial thyristor.

The thyristor circuit according to the invention is suitably supplemented by a bias voltage source which biases the junction between said first emitter layer and adjacent base layers in the reverse direction so that the tendency of the thyristor to break over at rapidly increasing off-state voltage is decreased.

Figure 2:
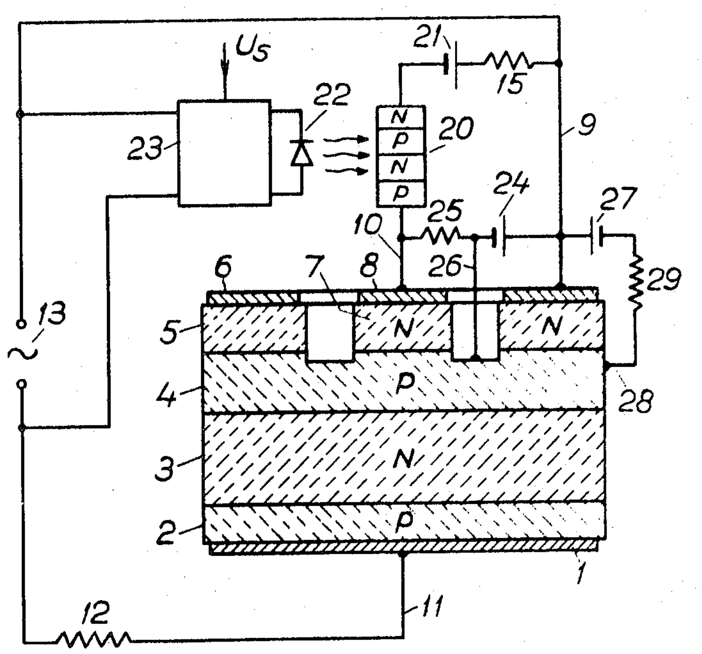
Figure 3:
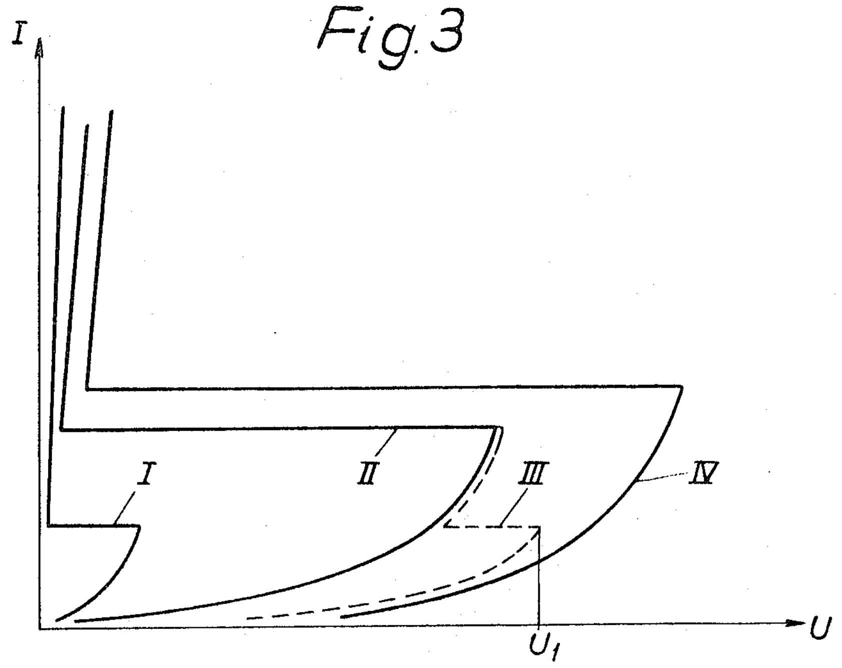

The invention will be further described with reference to the accompanying drawings where FIGS. 1 and 2 show thyristor circuits according to the invention and FIG. 3 the current-voltage characteristics of the elements in the circuit according to FIG. 1 during off-state voltage.

BRIEF DESCRIPTION OF THE PREFERRED EMBODIMENTS

In FIG. 1, 1 is a support plate of metal, for example molybdenum, to which a single-crystal circular silicon wafer is welded. The wafer comprises the P-conducting emitter layer 2, the N-conducting base layer 3, the P-conducting base layer 4 and an N-conducting emitter layer which consists of two parts. The annular part 5, together with the layers 2–4, forms a first thyristor, the main thyristor, and is provided with a metal layer 6 constituting the cathode contact, and the cathode conductor 9. The circular part 7 situated inside the annular part 5 and separated from it, together with the layers 2–4, forms a second thyristor, the firing thyristor with the cathode contact 8 and cathode conductor 10. The common anode conductor 11 is connected to the support plate 1. The main thyristor is connected in series by its anode and cathode conductors with a load object 12 to an alternating current source 13 and, by adjusting the phase position of the ignition point for the thyristor in relation to the feeding alternating voltage, the average value of the load current can be controlled in known manner. Between cathodes 10 and 9 of the firing thyristor and the main thyristor, the auxiliary diode thyristor 14 is connected in series with the resistor 15 and turned so that its conducting direction coincides with the conducting direction of the firing thyristor. Between the cathodes of the main thyristor and the firing thyristor, the symbolically shown control device is connected consisting of the voltage source 17 (its polarity may be opposite to that shown) and the switch 18.

As can be seen from the drawings the P base layer 4 is thinner under the N emitter part 7 than otherwise. The firing thyristor 2, 3, 4, 7 thus has lower breakover voltage in forward direction than the main thyristor 2, 3, 4, 5. The U-I characteristic of the firing thyristor in the forward direction consists of curve II in FIG. 3, that of the diode thyristor of curve I, whereas the characteristic of both these elements series connected consists of curve III. The characteristic of the main thyristor consists of curve IV. At an increasing voltage in the forward direction over the thyristor circuit, the diode thyristor 14 is ignited first at the voltage $U_1$. The voltage over the firing thyristor then increases instantaneously to a value exceeding the breakover voltage of this thyristor and it ignites, rapidly and over its entire surface simultaneously, thanks to the capacitive displacement current arising when the diode thyristor breaks over, after which the ignition spreads sideways to the main thyristor. The resistor 15, which may be replaced by a reactor, limits the load current through the firing thyristor. The process described above is thus the breakover process. However, the thyristor may also be ignited in the normal manner, with the help of the control device 17–18, by superimposing a positive or negative voltage on the connection 10 in comparison to the cathode 9.

Instead of making the P base layer thinner under the N emitter part 7, the P base layer under the emitter part 5 may be given a certain concentration of a material reducing its lifetime, for example by diffusing gold into this part so that the desired effect, a higher breakover voltage for the main thyristor 2, 3, 4, 5 is obtained.

In the embodiment shown in FIG. 2 an optically controlled thyristor 20 is series connected to the firing thyristor 2, 3, 4, 7. This optically controlled auxiliary thyristor 20 is ignited with the help of light pulses from the light diode 22 which is controlled by the control pulse device 23. This emits control pulses having a phase position in relation to the alternating voltage 13, which phase position is dependent on the control signal $U_s$. A bias voltage source 21 emits a bias voltage to the series connection of the thyristor 20 and firing thyristor 2, 3, 4, 7 such that the breakover voltage in the forward direction is lower for this series connection than for the main thyristor 2, 3, 4, 5. The process during the breakover will be the same as during the connection shown in FIG. 1 and the same good breakover capability is obtained. The tendency to breakover is reduced with the help of bias voltage sources 24 and 27 which, through the resistors 25 and 29 and the contacts 8, 26 and 28, give negative bias voltage to the P base layer 4 and the N emitter layer 7.

In order to obtain the desired effect, the voltages of the bias voltage sources 21, 24 and 27 should have a certain relationship to each other. The bias voltage source 21 connected in series with the auxiliary thyristor 20 should have a voltage which exceeds a certain value determined, for example by the voltage of the bias voltage sources 24 and 27. A condition can be obtained with the help of the following definitions:

$U_o$ = the voltage of the bias voltage source 21

$U_1$ = the bias voltage of the junction between the layers 4 and 7 generated by the bias voltage sources 24 and 27

$K=C_1/C_2$, where $C_1$ is the capacitance of the junction between the layers 4 and 7 and $C_2$ is the capacitance of the part of the junction between the layers 3 and 4 which is situated under the layer 7.

The condition becomes:

$$U_o>(U_1+1)\,(k+1)$$

In a typical thyristor circuit according to the invention the voltage of the bias voltage source 21 is 100 v. and the voltage of the bias voltage sources 24 and 27 is 10 v.

I claim:

1. Thyristor circuit comprising a first thyristor with first and second emitter layers of opposite conductivity and two base layers of opposite conductivity arranged between the emitter layers, the first emitter layer comprising first and second separate parts, the first of these parts being provided with a connection for the load current of the thyristor, in which means is provided to impress upon the second part only of the first emitter layer a rapidly rising voltage, said means including an auxiliary thyristor connected between said second part of the first emitter layer and the load current connection of the first part of the first emitter layer and in which the breakover voltage in the forward direction of the series connection of the auxiliary thyristor and the partial thyristor composed of the second part of the first emitter layer and the other layers of the first thyristor is lower than the breakover voltage for the rest of said first thyristor, the base layer adjacent to said first emitter layer being thinner under said second part of the first emitter layer than under the first part of the emitter layer.

2. Thyristor circuit according to claim 1, in which an impedance element to limit the current through the auxiliary thyristor is connected in series therewith.

3. Thyristor circuit according to claim 1, in which the life of the minority charge carrier in at least one of the base layers is higher in said partial thyristor than in any other part.

4. Thyristor circuit according to claim 3, in which said first thyristor has a higher concentration of a heavy metal reducing the carrier lifetime than said partial thyristor.

5. Thyristor circuit according to claim 1, in which said auxiliary thyristor is a PNPN diode.

6. Thyristor circuit according to claim 1, in which said auxiliary thyristor is an optically controlled thyristor.

7. Thyristor circuit according to claim 1, in which a first bias voltage source is connected in series with said second thyristor and has such polarity that the junction between the second part of said first emitter layer and the adjacent base layer is biased in the forward direction.

8. Thyristor circuit according to claim 7, in which a second bias voltage source is connected between at least one of the two parts of said first emitter layer and the base layer adjacent thereto.

* * * * *